(12) United States Patent
Liu et al.

(10) Patent No.: US 8,867,272 B2
(45) Date of Patent: Oct. 21, 2014

(54) METHOD OF ACCESSING A NON-VOLATILE MEMORY

(75) Inventors: Yi Chun Liu, Hsinchu (TW); Chung-hsun Lee, Hsinchu (TW); Ming Hung Chou, Hsinchu (TW)

(73) Assignee: Skymedi Corporation, Hsinchu (TW)

(*) Notice: Subject to any disclaimer, the term of this patent is extended or adjusted under 35 U.S.C. 154(b) by 282 days.

(21) Appl. No.: 13/556,807

(22) Filed: Jul. 24, 2012

(65) Prior Publication Data

US 2014/0032813 A1    Jan. 30, 2014

(51) Int. Cl.
*G11C 11/34* (2006.01)

(52) U.S. Cl.
USPC ............................ 365/185.09; 365/189.011

(58) Field of Classification Search
CPC .............. G11C 11/5628; G11C 16/10; G11C 2029/0411
USPC ...................... 365/185.09, 189.011
See application file for complete search history.

(56) References Cited

U.S. PATENT DOCUMENTS 8,634,240 B2 * 1/2014 Gavens et al. ........... 365/185.09

FOREIGN PATENT DOCUMENTS

TW          201312348 A1     3/2013

* cited by examiner

*Primary Examiner* — Son Dinh
*Assistant Examiner* — Nam Nguyen
(74) *Attorney, Agent, or Firm* — Donald E. Stout; Stout, Uxa & Buyan, LLP

(57) ABSTRACT

A method of accessing a non-volatile memory is disclosed. Original bits of data are duplicated on a bit level to generate a plurality of duplicated bits corresponding to each original bit. At least one shielding bit is provided between the duplicated bits corresponding to different original bits. The duplicated bits and the at least one shielding bit are programmed to the non-volatile memory. The original bits are generated or determined according to the duplicated bits.

25 Claims, 19 Drawing Sheets

| | BL0 | BL1 | BL2 | ... | BL6 | BL7 | BL8 | BL9 | ... | BL62 | BL63 | BL64 | BL65 | ... | BLn-1 | BLn |
|---|---|---|---|---|---|---|---|---|---|---|---|---|---|---|---|---|
| WL0 LSB | $a0^0$ | $a0^1$ | $a0^2$ | ... | $a0^6$ | sb | $a1^0$ | $a1^1$ | ... | $a7^6$ | sb | $b0^1$ | $b0^2$ | ... | $z7^6$ | sb |
| WL0 CSB | $a0^0$ | $a0^1$ | $a0^2$ | ... | $a0^6$ | sb | $a1^0$ | $a1^1$ | ... | $a7^6$ | sb | $b0^1$ | $b0^2$ | ... | $z7^6$ | sb |
| WL0 MSB | $a0^0$ | $a0^1$ | $a0^2$ | ... | $a0^6$ | sb | $a1^0$ | $a1^1$ | ... | $a7^6$ | sb | $b0^1$ | $b0^2$ | ... | $z7^6$ | sb |

| | BLe | BLo | BLe | BLo | ... | BLe | BLo | BLe | BLo | ... | BLe | BLo |
|---|---|---|---|---|---|---|---|---|---|---|---|---|
| WL0 | $a0^0$ | $a0^0$ | $a0^1$ | $a0^1$ | ... | $a7$ | $a7$ | $b0^0$ | $b0^0$ | ... | $z7^7$ | $z7^7$ |

FIG.5C

| | | BLe | BLo | BLe | BLo | ... | BLe | BLo | BLe | BLo | ... | BLe | BLo |
|---|---|---|---|---|---|---|---|---|---|---|---|---|---|
| WL0 | LSB | $a0^0$ | $a0^0$ | $a0^1$ | $a0^1$ | ... | $a0^7$ | $a7$ | $a7$ | $b0^0$ | ... | $z7^7$ | $z7^7$ |
| | CSB | $a0^0$ | $a0^0$ | $a0^1$ | $a0^1$ | ... | $a0^7$ | $a7$ | $a7$ | $b0^0$ | ... | $z7^7$ | $z7^7$ |
| | MSB | $a0^0$ | $a0^0$ | $a0^1$ | $a0^1$ | ... | $a0^7$ | $a7$ | $a7$ | $b0^0$ | ... | $z7^7$ | $z7^7$ |

| | BLe | BLo | BLe | BLo | ... | BLe | BLo | BLe | BLo |
|---|---|---|---|---|---|---|---|---|---|
| WL0 | $a0^0$ DD | $a0^1$ DD | $a0^7$ DD | $a1^0$ DD | ... | $a7^0$ DD | $b0^0$ DD | ... | $z7^0$ DD |

FIG.6A

| | | BLe | BLo | BLe | BLo | ... | BLe | BLo | BLe | BLo |
|---|---|---|---|---|---|---|---|---|---|---|
| WL0 | LSB | $a0^0$ DD | $a0^1$ DD | $a0^7$ DD | $a1^0$ DD | ... | $a7^0$ DD | $b0^0$ DD | ... | $z7^0$ DD |
| | CSB | $a0^0$ DD | $a0^1$ DD | $a0^7$ DD | $a1^0$ DD | ... | $a7^0$ DD | $b0^0$ DD | ... | $z7^0$ DD |
| | MSB | $a0^0$ DD | $a0^1$ DD | $a0^7$ DD | $a1^0$ DD | ... | $a7^0$ DD | $b0^0$ DD | ... | $z7^0$ DD |

FIG.6B

| | BLe | BLo | ... | BLe | BLo | ... | BLe | BLo | ... | BLe | BLo |
|---|---|---|---|---|---|---|---|---|---|---|---|
| WL0 LSB | $a0^0$ | DD | ... | $a0^1$ | DD | ... | $a0^7$ | DD | ... | $a7^7$ | DD | $z7^7$ |
| WL0 CSB | $a0^0$ | DD | ... | $a0^1$ | DD | ... | $a0^7$ | DD | ... | $a7^7$ | DD | $z7^7$ |
| WL0 MSB | $a0^0$ | DD | ... | $a0^1$ | DD | ... | $a0^7$ | DD | ... | $a7^7$ | DD | $z7^7$ |
| WL1 LSB | DD | $a0^0$ | ... | DD | $a1^0$ | ... | DD | $a7^0$ | ... | DD | $b0^0$ | ... | DD | $z7^7$ |
| WL1 CSB | DD | $a0^0$ | ... | DD | $a1^0$ | ... | DD | $a7^0$ | ... | DD | $b0^0$ | ... | DD | $z7^7$ |
| WL1 MSB | DD | $a0^0$ | ... | DD | $a1^0$ | ... | DD | $a7^0$ | ... | DD | $b0^0$ | ... | DD | $z7^7$ |

FIG.6C

| | | BLe | BLo | BLe | BLo | ... | BLe | BLo | BLe | BLo | ... | BLe | BLo | BLe | BLo |
|---|---|---|---|---|---|---|---|---|---|---|---|---|---|---|---|
| WL0 | LSB | $a0^0$ | DD | $a0^1$ | DD | ... | $a0^7$ | DD | DD | $a1^0$ | ... | $a7^7$ | DD | DD | $b0^0$ | ... | DD | $z7^7$ | DD |
| | CSB | $a0^0$ | DD | $a0^1$ | DD | ... | $a0^7$ | DD | DD | $a1^0$ | ... | $a7^7$ | DD | DD | $b0^0$ | ... | $z7^7$ | DD |
| | MSB | $a0^0$ | DD | $a0^1$ | DD | ... | $a0^7$ | DD | DD | $a1^0$ | ... | $a7^7$ | DD | DD | $b0^0$ | ... | $z7^7$ | DD |
| WL1 | LSB | DD | $a0^0$ | DD | $a0^1$ | ... | DD | $a0^7$ | $a1^0$ | DD | ... | DD | $a7^7$ | $b0^0$ | DD | ... | DD | $z7^7$ |
| | CSB | DD | $a0^0$ | DD | $a0^1$ | ... | DD | $a0^7$ | $a1^0$ | DD | ... | DD | $a7^7$ | $b0^0$ | DD | ... | DD | $z7^7$ |
| | MSB | DD | $a0^0$ | DD | $a0^1$ | ... | DD | $a0^7$ | $a1^0$ | DD | ... | DD | $a7^7$ | $b0^0$ | DD | ... | DD | $z7^7$ |
| WL2 | LSB | ~$a0^0$ | DD | ~$a0^1$ | DD | ... | ~$a0^7$ | DD | DD | ~$a1^0$ | ... | ~$a7^7$ | DD | DD | ~$b0^0$ | ... | ~$z7^7$ | DD |
| | CSB | ~$a0^0$ | DD | ~$a0^1$ | DD | ... | ~$a0^7$ | DD | DD | ~$a1^0$ | ... | ~$a7^7$ | DD | DD | ~$b0^0$ | ... | ~$z7^7$ | DD |
| | MSB | ~$a0^0$ | DD | ~$a0^1$ | DD | ... | ~$a0^7$ | DD | DD | ~$a1^0$ | ... | ~$a7^7$ | DD | DD | ~$b0^0$ | ... | ~$z7^7$ | DD |

FIG.6D

| | BLe | BLo | BLe | BLo | ... | BLe | BLo | BLe | BLo | ... | BLe | BLo | BLe | BLo |
|---|---|---|---|---|---|---|---|---|---|---|---|---|---|---|
| WL0 | a0 | $a0^1$ | a1 | $a1^1$ | ... | a7 | $a7^1$ | b0 | $b0^1$ | ... | z6 | $z6^1$ | z7 | $z7^1$ |

FIG.7B

| | | BLe | BLo | BLe | BLo | ... | BLe | BLo | BLe | BLo | ... | BLe | BLo | BLe | BLo |
|---|---|---|---|---|---|---|---|---|---|---|---|---|---|---|---|
| WL0 | LSB | a0 | $a0^1$ | a1 | $a1^1$ | ... | a7 | $a7^1$ | b0 | $b0^1$ | ... | z6 | $z6^1$ | z7 | $z7^1$ |
| | CSB | a0 | $a0^1$ | a1 | $a1^1$ | ... | a7 | $a7^1$ | b0 | $b0^1$ | ... | z6 | $z6^1$ | z7 | $z7^1$ |
| | MSB | a0 | $a0^1$ | a1 | $a1^1$ | ... | a7 | $a7^1$ | b0 | $b0^1$ | ... | z6 | $z6^1$ | z7 | $z7^1$ |

FIG.7C

| | BLe | BLo | BLe | BLo | ... | BLe | BLo | BLe | BLo |
|---|---|---|---|---|---|---|---|---|---|
| WL0 | a0 | DD | a1 | DD | ... | a7 | DD | b0 | DD | ... | z6 | DD | z7 | DD |

FIG.8A

| | | BLe | BLo | BLe | BLo | ... | BLe | BLo | BLe | BLo |
|---|---|---|---|---|---|---|---|---|---|---|
| | LSB | a0 | DD | a1 | DD | ... | a7 | DD | b0 | DD | ... | z6 | DD | z7 | DD |
| WL0 | CSB | a0 | DD | a1 | DD | ... | a7 | DD | b0 | DD | ... | z6 | DD | z7 | DD |
| | MSB | a0 | DD | a1 | DD | ... | a7 | DD | b0 | DD | ... | z6 | DD | z7 | DD |

FIG.8B

| | | BL0 | BL1 | BL2 | ... | BL6 | BL7 | BL8 | BL9 | ... | BL62 | BL63 | BL64 | BL65 | ... | BLn-1 | BLn |
|---|---|---|---|---|---|---|---|---|---|---|---|---|---|---|---|---|---|
| WL0 | LSB | $a0^0$ | $a0^1$ | $a0^2$ | ... | $a0^6$ | sb | $a1^0$ | $a1^1$ | ... | $a7^6$ | sb | $b0^1$ | $b0^2$ | ... | $z7^6$ | sb |
| | CSB | $a0^0$ | $a0^1$ | $a0^2$ | ... | $a0^6$ | sb | $a1^0$ | $a1^1$ | ... | $a7^6$ | sb | $b0^1$ | $b0^2$ | ... | $z7^6$ | sb |
| | MSB | $a0^0$ | $a0^1$ | $a0^2$ | ... | $a0^6$ | sb | $a1^0$ | $a1^1$ | ... | $a7^6$ | sb | $b0^1$ | $b0^2$ | ... | $z7^6$ | sb |
| WL1 | LSB | DD | DD | DD | ... | DD | DD | DD | DD | ... | DD | DD | DD | DD | ... | DD | DD |
| | CSB | DD | DD | DD | ... | DD | DD | DD | DD | ... | DD | DD | DD | DD | ... | DD | DD |
| | MSB | DD | DD | DD | ... | DD | DD | DD | DD | ... | DD | DD | DD | DD | ... | DD | DD |

FIG.9A

| | | BLe | BLo | ... | BLe | BLo | BLe | BLo | ... | BLe | BLo | BLe | BLo | ... | BLe | BLo |
|---|---|---|---|---|---|---|---|---|---|---|---|---|---|---|---|---|
| WL0 | LSB | $a0^0$ | $a0^0$ | ... | $a0^1$ | $a0^1$ | ... | $a0^7$ | $a0^7$ | ... | $a1^0$ | $a1^0$ | ... | $a7^7$ | $a7^7$ | ... | $b0^0$ | $b0^0$ | ... | $z7^7$ | $z7^7$ |
| | CSB | $a0^0$ | $a0^0$ | ... | $a0^1$ | $a0^1$ | ... | $a0^7$ | $a0^7$ | ... | $a1^0$ | $a1^0$ | ... | $a7^7$ | $a7^7$ | ... | $b0^0$ | $b0^0$ | ... | $z7^7$ | $z7^7$ |
| | MSB | $a0^0$ | $a0^0$ | ... | $a0^1$ | $a0^1$ | ... | $a0^7$ | $a0^7$ | ... | $a1^0$ | $a1^0$ | ... | $a7^7$ | $a7^7$ | ... | $b0^0$ | $b0^0$ | ... | $z7^7$ | $z7^7$ |
| WL1 | LSB | DD | DD | ... | DD | DD | ... | DD | DD | ... | DD | DD | ... | DD | DD | ... | DD | DD | ... | DD | DD |
| | CSB | DD | DD | ... | DD | DD | ... | DD | DD | ... | DD | DD | ... | DD | DD | ... | DD | DD | ... | DD | DD |
| | MSB | DD | DD | ... | DD | DD | ... | DD | DD | ... | DD | DD | ... | DD | DD | ... | DD | DD | ... | DD | DD |

FIG.9B

| | BL0 | BL1 | BL2 | ... | BL6 | BL7 | BL8 | BL9 | ... | BL62 | BL63 | BL64 | BL65 | ... | BLn-1 | BLn |
|---|---|---|---|---|---|---|---|---|---|---|---|---|---|---|---|---|
| WL0 LSB | $a0^0$ | $a0^1$ | $a0^2$ | ... | $a0^6$ | sb | $a1^0$ | $a1^1$ | ... | $a7^6$ | sb | $b0^1$ | $b0^2$ | ... | $z7^6$ | sb |
| WL0 CSB | $a0^0$ | $a0^1$ | $a0^2$ | ... | $a0^6$ | sb | $a1^0$ | $a1^1$ | ... | $a7^6$ | sb | $b0^1$ | $b0^2$ | ... | $z7^6$ | sb |
| WL0 MSB | $a0^0$ | $a0^1$ | $a0^2$ | ... | $a0^6$ | sb | $a1^0$ | $a1^1$ | ... | $a7^6$ | sb | $b0^1$ | $b0^2$ | ... | $z7^6$ | sb |
| WL1 LSB | DD | DD | DD | ... | DD | DD | DD | DD | ... | DD | DD | DD | DD | ... | DD | DD |
| WL1 CSB | DD | DD | DD | ... | DD | DD | DD | DD | ... | DD | DD | DD | DD | ... | DD | DD |
| WL1 MSB | DD | DD | DD | ... | DD | DD | DD | DD | ... | DD | DD | DD | DD | ... | DD | DD |
| WL2 LSB | $\sim a0^0$ | $\sim a0^1$ | $\sim a0^2$ | ... | $\sim a0^6$ | sb | $\sim a1^0$ | $\sim a1^1$ | ... | $\sim a7^6$ | sb | $\sim b0^1$ | $\sim b0^2$ | ... | $\sim z7^6$ | sb |
| WL2 CSB | $\sim a0^0$ | $\sim a0^1$ | $\sim a0^2$ | ... | $\sim a0^6$ | sb | $\sim a1^0$ | $\sim a1^1$ | ... | $\sim a7^6$ | sb | $\sim b0^1$ | $\sim b0^2$ | ... | $\sim z7^6$ | sb |
| WL2 MSB | $\sim a0^0$ | $\sim a0^1$ | $\sim a0^2$ | ... | $\sim a0^6$ | sb | $\sim a1^0$ | $\sim a1^1$ | ... | $\sim a7^6$ | sb | $\sim b0^1$ | $\sim b0^2$ | ... | $\sim z7^6$ | sb |
| WL3 LSB | DD | DD | DD | ... | DD | DD | DD | DD | ... | DD | DD | DD | DD | ... | DD | DD |
| WL3 CSB | DD | DD | DD | ... | DD | DD | DD | DD | ... | DD | DD | DD | DD | ... | DD | DD |
| WL3 MSB | DD | DD | DD | ... | DD | DD | DD | DD | ... | DD | DD | DD | DD | ... | DD | DD |

FIG.9C

| | BL0 | BL1 | BL2 | ... | BL6 | BL7 | BL8 | BL9 | BL10 | ... | BL14 | BL15 | BL16 | ... | BLn-1 | BLn |
|---|---|---|---|---|---|---|---|---|---|---|---|---|---|---|---|---|
| WL0 LSB | $a0^0$ | $a0^1$ | $a0^2$ | ... | $a0^6$ | sb | $a0^0$ | $a0^1$ | $a0^2$ | ... | $a0^6$ | sb | $a1^0$ | ... | $z7^6$ | sb |
| WL0 CSB | $a0^0$ | $a0^1$ | $a0^2$ | ... | $a0^6$ | sb | $a0^0$ | $a0^1$ | $a0^2$ | ... | $a0^6$ | sb | $a1^0$ | ... | $z7^6$ | sb |
| WL0 MSB | $a0^0$ | $a0^1$ | $a0^2$ | ... | $a0^6$ | sb | $a0^0$ | $a0^1$ | $a0^2$ | ... | $a0^6$ | sb | $a1^0$ | ... | $z7^6$ | sb |
| WL1 LSB | DD | DD | DD | ... | DD | DD | DD | DD | DD | ... | DD | DD | DD | ... | DD | DD |
| WL1 CSB | DD | DD | DD | ... | DD | DD | DD | DD | DD | ... | DD | DD | DD | ... | DD | DD |
| WL1 MSB | DD | DD | DD | ... | DD | DD | DD | DD | DD | ... | DD | DD | DD | ... | DD | DD |
| WLn LSB | DD | DD | DD | ... | $a0^6$ | sb | $\sim a0^0$ | $\sim a0^1$ | $\sim a0^2$ | ... | $\sim a0^6$ | sb | $\sim a1^0$ | ... | $\sim z7^6$ | sb |
| WLn CSB | DD | DD | DD | ... | $a0^6$ | sb | $\sim a0^0$ | $\sim a0^1$ | $\sim a0^2$ | ... | $\sim a0^6$ | sb | $\sim a1^0$ | ... | $\sim z7^6$ | sb |
| WLn MSB | DD | DD | DD | ... | $a0^6$ | sb | $\sim a0^0$ | $\sim a0^1$ | $\sim a0^2$ | ... | $\sim a0^6$ | sb | $\sim a1^0$ | ... | $\sim z7^6$ | sb |
| WLn+1 LSB | DD | DD | DD | ... | DD | DD | DD | DD | DD | ... | DD | DD | DD | ... | DD | DD |
| WLn+1 CSB | DD | DD | DD | ... | DD | DD | DD | DD | DD | ... | DD | DD | DD | ... | DD | DD |
| WLn+1 MSB | DD | DD | DD | ... | DD | DD | DD | DD | DD | ... | DD | DD | DD | ... | DD | DD |

FIG.10

METHOD OF ACCESSING A NON-VOLATILE MEMORY

BACKGROUND OF THE INVENTION

1. Field of the Invention

The present invention generally relates to a non-volatile memory, and more particularly to a method of accessing a non-volatile memory without being affected by coupling effect and bad column problem.

2. Description of Related Art

A flash memory is a non-volatile solid state memory device that can be electrically erased and reprogrammed. A conventional flash memory stores a single bit of information in each memory cell such that each memory cell can be programmed to assume two possible states. The conventional flash memory is thus commonly referred to as a single-bit per cell flash memory. A modern flash memory is capable of storing two or more bits of information in each memory cell such that each memory cell can be programmed to assume more than two possible states. The modern flash memory is thus commonly referred to as a multi-bit per cell flash memory.

FIG. 1 schematically shows a NAND flash memory, which is comprised of an array of floating gate memory cells 11 arranged in an n-by-m array. Word lines WL0 through WLn−1 select individual floating gate memory cells in rows. The floating gate memory cells 11 in columns are coupled drain to source to form bit lines BL0 through BLm-1, which are correspondingly coupled to sense amplifiers.

As memory storage density increases and/or more bits are stored in a single cell, capacitive coupling among the floating gate memory cells 11 increases as well. The coupling effect may be reduced, for example, by filtering high-frequency components of signals in a memory controller, or employing fault-tolerant design in a flash memory, however, at the expense of overall cost and system complexity.

A manufactured flash memory may ordinarily have some defect bit lines, usually referred to as bad columns. The bad column problem may be overcome, for example, by utilizing a replacement circuit employed in the flash memory to redirect data to a spare area in the flash memory which, however, suffers the disadvantage of high cost. The bad column problem may, alternatively, be overcome by a memory controller that skips the defect bit line while accessing the flash memory.

Conventional schemes for overcoming the bad column problem require initially storing parameters in the flash memory, based on which the memory controller then may be properly initialized for use with the flash memory. Paradoxically, the parameters that the memory controller demands for overcoming the problems caused by defect or imperfect in the flash memory may probably be initially stored in defect area of the flash memory.

A need has thus arisen to propose a novel scheme of accessing a non-volatile memory in an effective and economic manner.

SUMMARY OF THE INVENTION

In view of the foregoing, an embodiment of the present invention provides a method of accurately accessing data in a non-volatile memory without being affected by coupling effect and bad column problem.

According to one embodiment, original bits of data are duplicated on a bit level to generate a plurality of duplicated bits corresponding to each original bit. At least one shielding bit is provided between the duplicated bits corresponding to different original bits. The duplicated bits and the at least one shielding bit are then programmed to the non-volatile memory. Thereafter, the original bits of data are generated or determined according to the duplicated bits.

BRIEF DESCRIPTION OF THE DRAWINGS

FIG. 4C shows an exemplary method of programming a multi-bit per cell flash memory according to the first embodiment of the present invention;

FIG. 5B and FIG. 5C illustrate a method of programming a flash memory according to the second embodiment of the present invention;

FIG. 6A to FIG. 6D illustrate a method of programming a flash memory according to an alternative second embodiment of the present invention;

FIG. 7B and FIG. 7C illustrate a method of programming a flash memory according to the third embodiment of the present invention;

FIG. 8A and FIG. 8B illustrate a method of programming a flash memory according to an alternative third embodiment of the present invention;

FIG. 9A to FIG. 9C illustrate a method of programming a flash memory according to a fourth embodiment of the present invention; and FIG. 10 illustrates a method of accessing a non-volatile memory taking bad column into consideration.

DETAILED DESCRIPTION OF THE INVENTION

Figure 1:
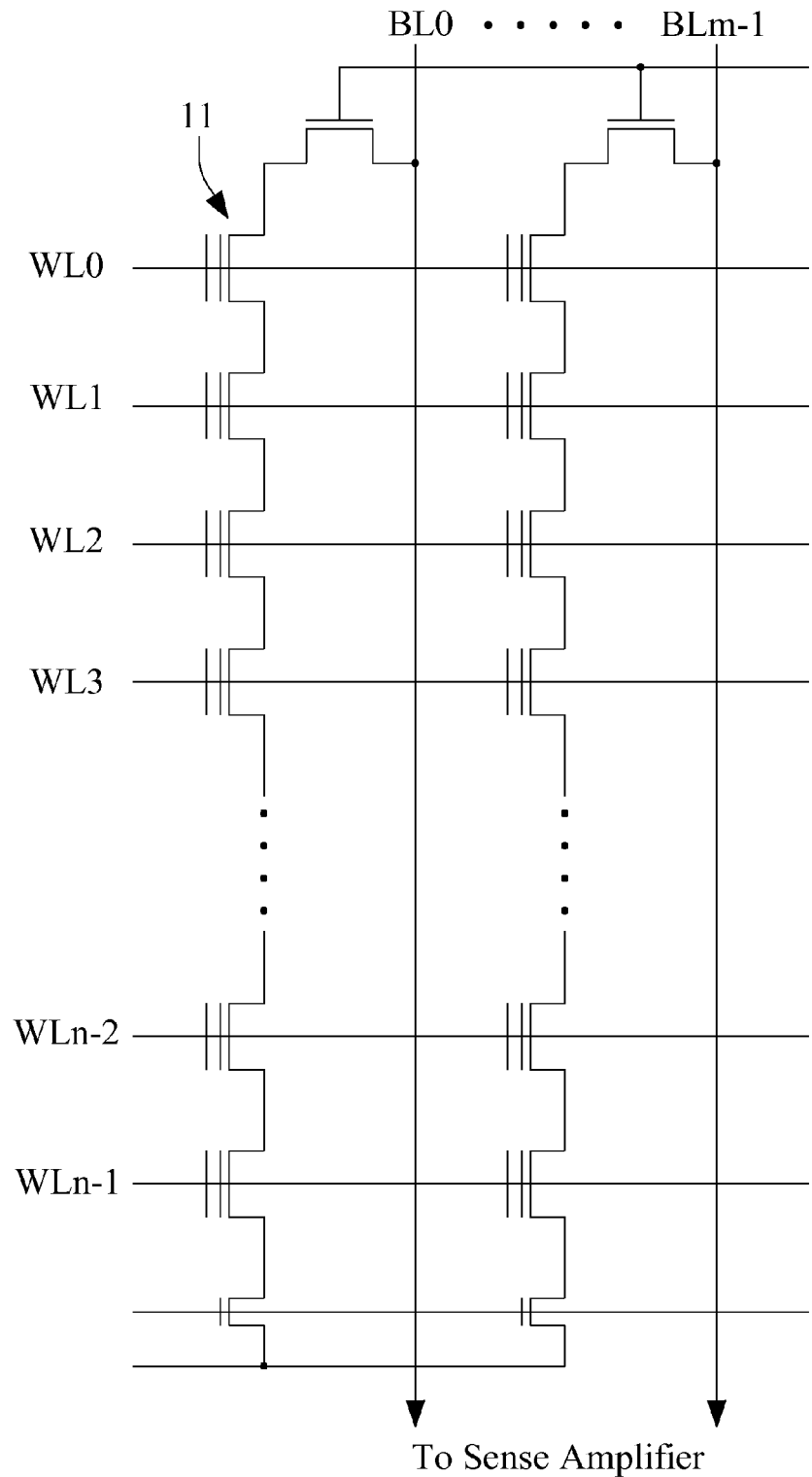
FIG. 1 schematically shows a NAND flash memory.
Figure 2:
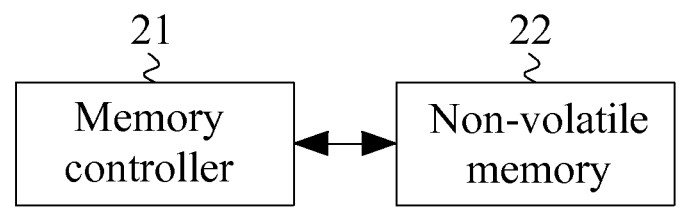
FIG. 2 shows a block diagram of a memory system.

A method of accessing data in a non-volatile memory is disclosed. The disclosed method may be operated in a memory controller 21, as shown in FIG. 2, which manages a flow of data going to and from a non-volatile memory 22, such as a flash memory. In an exemplary embodiment, parameters that are essential for initializing the non-volatile memory 22 for use with the memory controller 21 are written (or programmed) to the non-volatile memory 22 in a specific manner (to be described later), such that the parameters can later be correctly read from the non-volatile memory 22, even the parameters are partially corrupted. In addition, the disclosed method may be adapted to store crucial data or general data in the non-volatile memory 22. In this specification, the term "write" may be interchangeable with the term "program." Although a flash memory is exemplified in the embodiments, the disclosed method may be generally adapted to a non-volatile memory that can retain stored information even after power is turned off.

Figure 3:
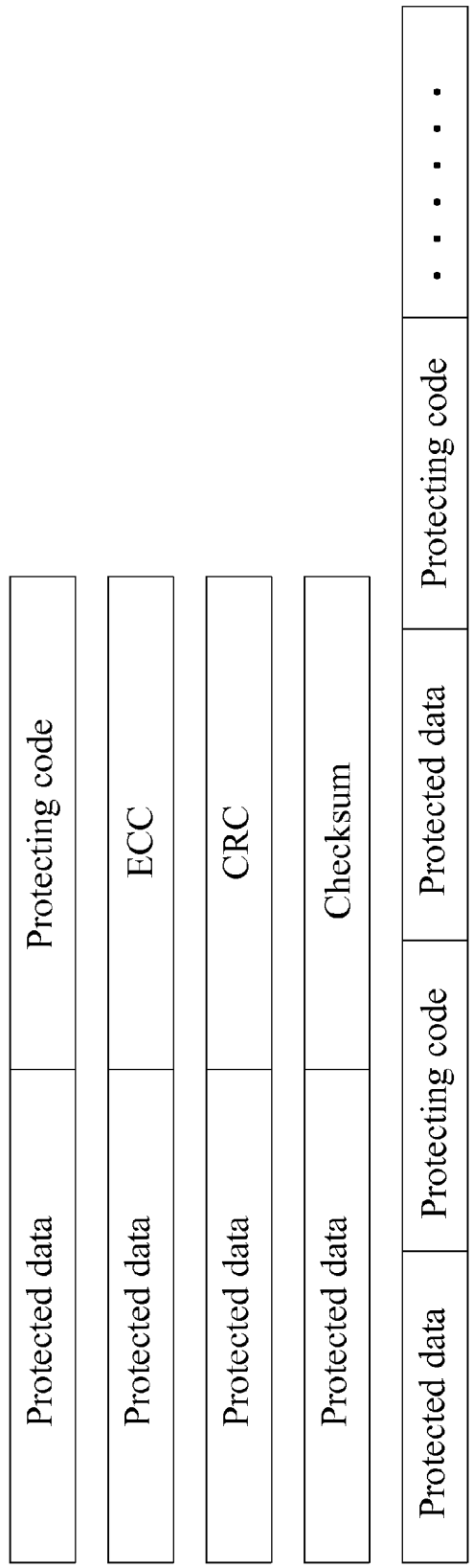
FIG. 3 shows some exemplary data structures of protected data and protecting code.

In this specification, the term "data" may refer to information (or data) to be protected, and may further include at least one protecting code that is used for error detection and/or correction to ensure integrity of the protected data. FIG. 3 shows some exemplary data structures of protected data and protecting code, for example, error-correcting code (ECC), cyclic redundancy check (CRC) or checksum.

Embodiment 1

Figure 4A:
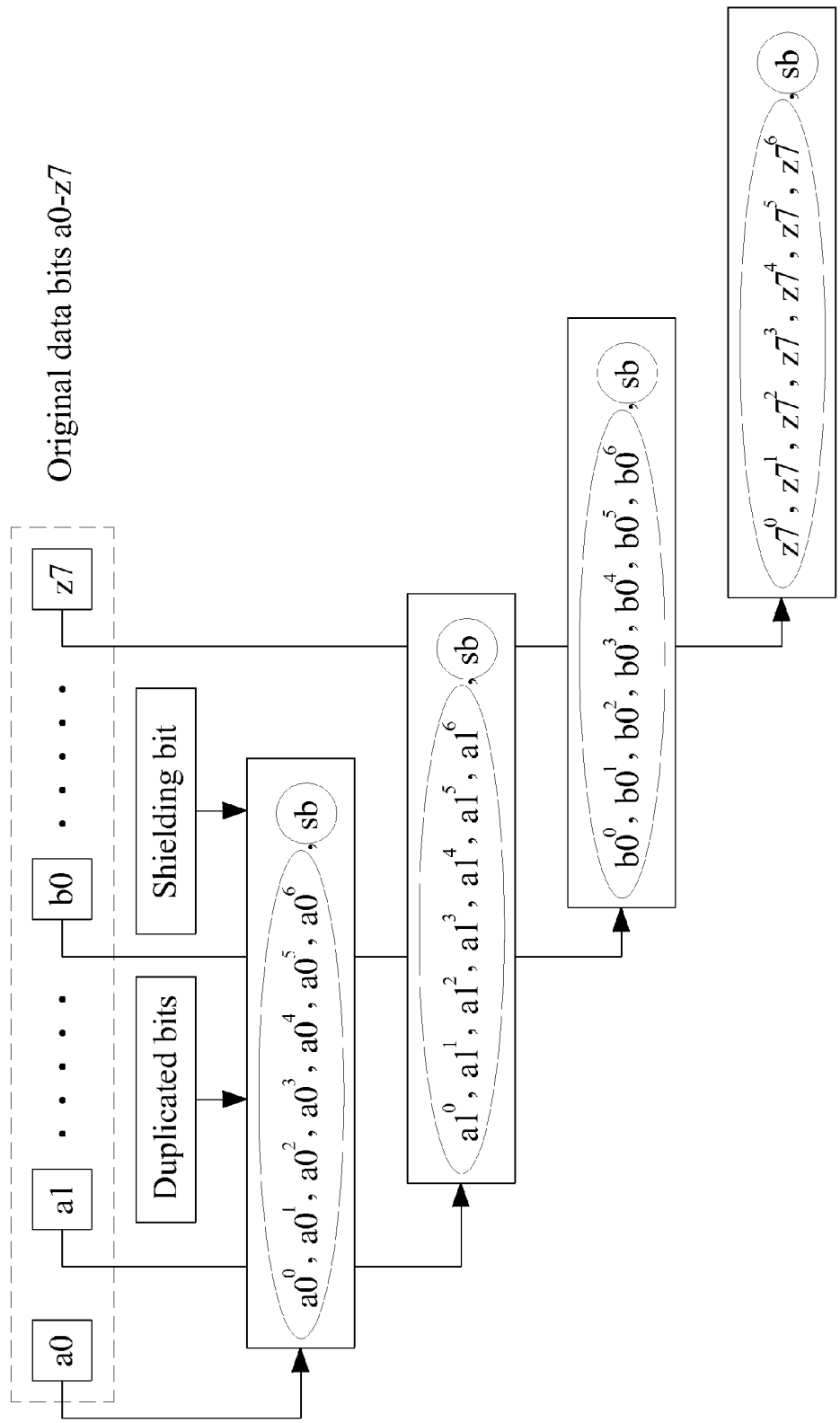
FIG. 4A and FIG. 4B show schematic diagrams illustrating a method of accessing a non-volatile memory according to a first embodiment of the present invention.

FIG. 4A shows a schematic diagram illustrating a method of accessing a non-volatile memory (hereinafter abbreviated to "memory" or "flash memory") according to a first embodiment of the present invention. In the embodiment, original bits of data (e.g., data to be written to memory) are duplicated in turn on a bit level to result in duplicated bits. As exemplified in FIG. 4A, original data comprise 26 bytes A, B, . . . Z, each including eight original bits, that is, A=(a0, a1, . . . a7), B=(b0, b1, . . . b7), Z=(z0, z2, . . . z7). The original bits are duplicated seven times in turn on a bit level, therefore generating duplicated bits $(a0^0, a0^1, \ldots a0^6)$, $(a1^0, a1^1, \ldots a1^6)$, ... $(b0^0, b0^1, \ldots b0^6)$, $(b1^0, b1^1, \ldots b1^6)$, ... $(z7^0, z7^1, \ldots z7^6)$ respectively, where $a0^0=a0^1 \ldots =a0^6$, $a1^0=a1^1 \ldots =a1^6$, etc. According to one aspect of the embodiment, duplicated bits corresponding to each original bit are followed with at least one (bit-line) shielding bit (sb). In the embodiment, the shielding bit is preferably different from the duplicated bits to prevent coupling effect. The shielding bit of the embodiment may preferably be programmed with data that may be represented by a voltage as low as possible. In one exemplary embodiment, the shielding bit may be programmed with dummy data, e.g., bit "1" that may be represented by the lowest voltage level in a memory cell.

Figure 4B:
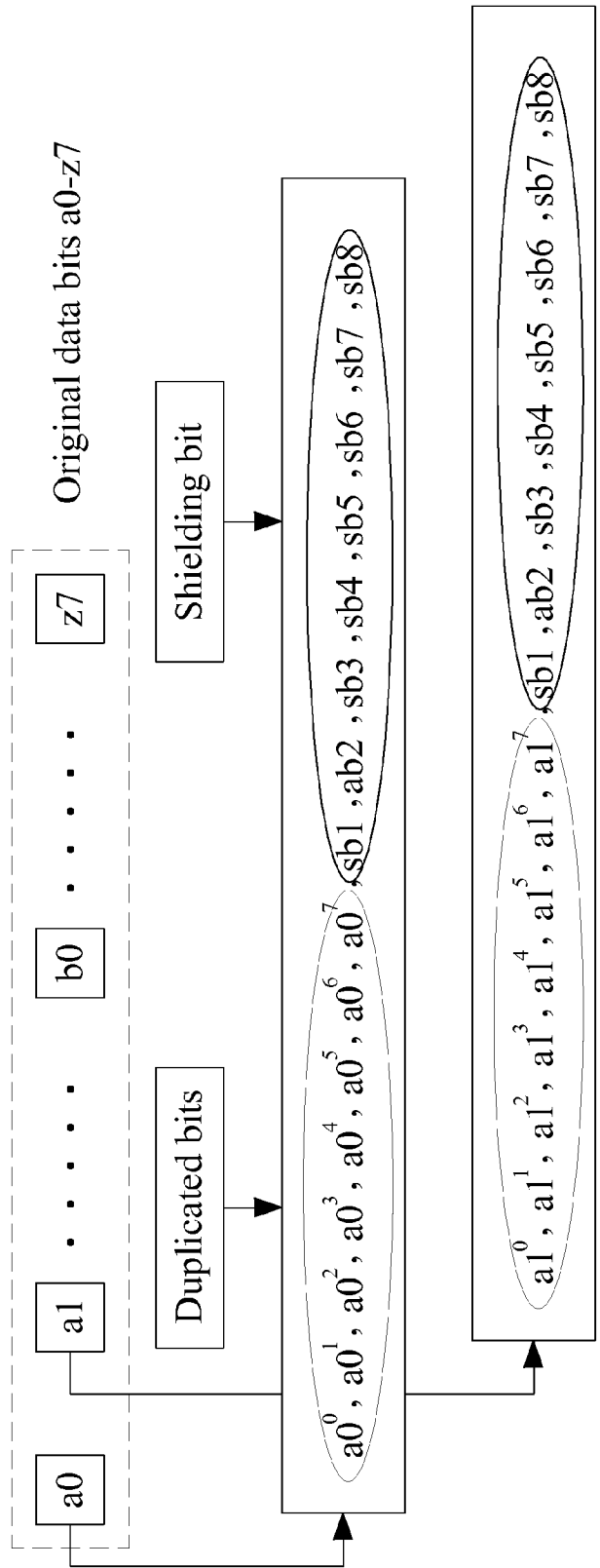

It is appreciated by those skilled in the pertinent art that the number of duplicated bits and the number of shielding bits corresponding to each original bit are not limited to those shown in FIG. 4A. For example, in a preferred embodiment as shown in FIG. 4B, the original bits are duplicated eight times in turn on a bit level, and the duplicated bits corresponding to each original bit are followed with eight shielding bits (sb1, sb2, . . . sb8).

With respect to a multi-bit per cell flash memory, for example, a 3-bit per cell (3 b/cell) flash memory in which each cell can store three bits of information (i.e., a least significant bit (LSB), a center significant bit (CSB) and a most significant bit (MSB)), some methods of programming data to a multi-bit per cell flash memory are provided as follows.

In a first method of programming data to a multi-bit per cell flash memory, as exemplified in FIG. 4C, the duplicated bits (e.g., $a0^0, a0^1, \ldots a0^6$) and shielding bit(s) (sb) are programmed to all pages (i.e., LSB, CSB and MSB pages) of a word line.

Figure 4D:
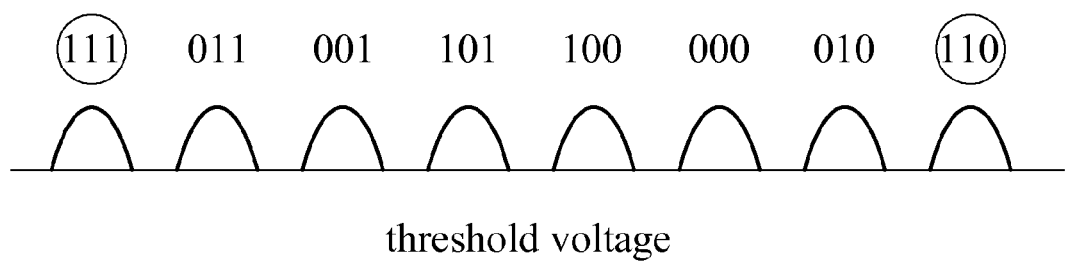
FIG. 4D shows threshold voltage distribution, after programming a multi-bit per cell flash memory according to the first embodiment of the present invention.

In a second method of programming data to a multi-bit per cell flash memory, only the LSB page is programmed with the duplicated bits and shielding bit(s), while other page(s) (e.g., CSB and MSB pages) are programmed with dummy data. In a preferred embodiment, the CSB and MSB pages are programmed with dummy data such that threshold voltage distributions of data "0" and "1" in the LSB page may be substantially far away from each other. As exemplified in FIG. 4D, the threshold voltage distributions of data "0" and "1" in the LSB page are located at two farthest ends (the lowest voltage level 111 and the highest voltage level 110), respectively, after programming with dummy data "11" in the CSB and MSB pages.

In a third method of programming data to a multi-bit per cell flash memory, the multi-bit per cell flash memory is configured, if the flash memory supports such configuration, as a single-bit per cell flash memory, which is then programmed with the duplicated bits and shielding bit(s). Alternatively, in the third method, only the LSB page is programmed with the duplicated bits and shielding bit(s).

According to the first embodiment disclosed above, the shielding bit(s) are used to prevent interference between the duplicated bits corresponding respectively to adjacent original bits (e.g., a0 and a1). Accordingly, the original bit may later be correctly read from the flash memory. For example, the original bit (a0) may be determined by reading one of the duplicated bits $(a0^0, a0^1, a0^2, a0^3, a0^4, a0^5, a0^6, a0^7)$. Preferably, the original bit (a0) may be determined by reading the middle one or ones (e.g., $a0^3$ and/or $a0^4$) of the duplicated bits. Some methods of reading data from a flash memory are provided in the embodiment.

In a first method of reading data from a flash memory, a page address for the duplicated bits is first determined, based on which the duplicated bits may be read (or retrieved) from the flash memory. The page address for the duplicated bits may be a predetermined page address, such as the first address of the flash memory. Alternatively, the page address may be set beforehand, for example, in a read only memory (ROM) or a one-time programmable (OTP) memory, in the memory controller (e.g., 21 in FIG. 2); or be externally set, for example, by a bonding pin of the memory controller 21. Subsequently, the original bit may be determined according to the corresponding duplicated bits by balloting (or majority). For example, the original bit a0 is determined as "1" if the number of "1" in the duplicated bits $(a0^0, a0^1, a0^2, a0^3, a0^4, a0^5, a0^6)$ is greater than the number of "0." The determined original bits may be further subjected to error detection and/or correction by an associated protecting code to ensure integrity of the protected data.

In a second method of reading data from a flash memory, after determining a page address for the duplicated bits, one of the duplicated bits corresponding to an original bit is selected, and the selected bits corresponding to different original bits are merged and then subjected to verification (i.e., error detection and/or correction) by an associated protecting code. If the verification fails, the selection discussed above is performed again with respect to at least another one of the duplicated bits. The selection and verification are repeatedly performed until the verification succeeds.

Embodiment 2

Figure 5A:
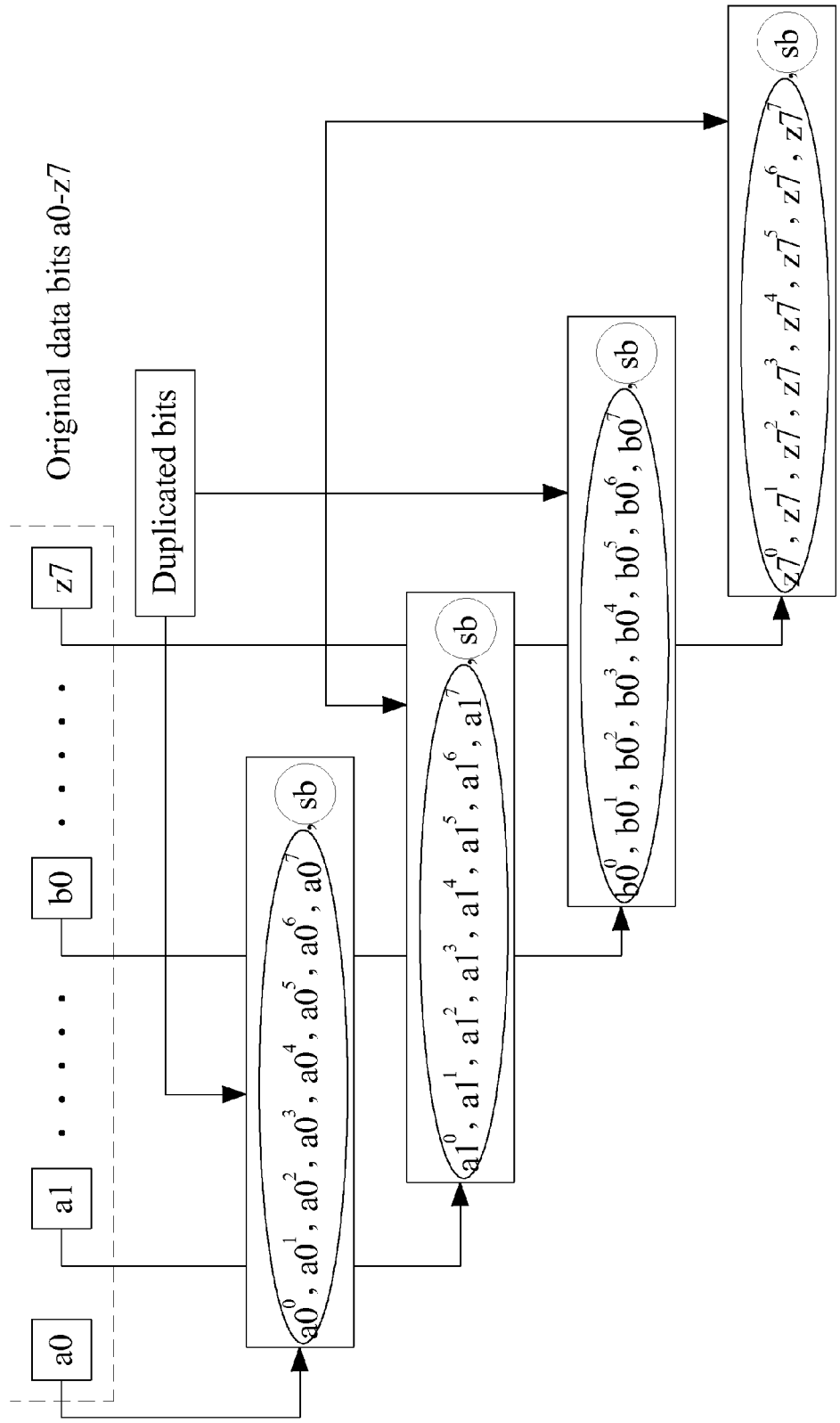
FIG. 5A shows schematic diagram illustrating a method of accessing a non-volatile memory according to a second embodiment of the present invention.

FIG. 5A shows a schematic diagram illustrating a method of accessing a non-volatile memory according to a second embodiment of the present invention. In the embodiment, original bits of data are duplicated in turn on a bit level to result in duplicated bits. As exemplified in FIG. 5A, original data comprise 26 bytes A, B, . . . Z, each including eight original bits, that is A=(a0, a1, . . . a7), B=(b0, b1, . . . b7), . . . Z=(z0, z1, . . . z7). The original bits are duplicated eight times in turn on a bit level, therefore generating duplicated bits $(a0^0, a0^1, \ldots a0^7)$, $(a1^0, a1^1, \ldots a1^7)$, ... $(b0^0, b0^1, \ldots b0^7)$, $(b1^0, b1^1, \ldots b1^7)$, ... $(z7^0, z7^1, \ldots z7^7)$ respectively, where $a0^0=a0^1 \ldots =a0^7$, $a1^0=a1^1 \ldots =a1^7$, etc. According to one aspect of the embodiment, as exemplified in FIG. 5B, duplicated bits corresponding to each original bit are programmed to noncontinuous first (e.g., even-numbered) bit lines of a word line, and said duplicated bits are also programmed to noncontinuous second (e.g., odd-numbered) bit lines of the word line, wherein the first bit lines are interspersed with the second bit lines. Compared with the first embodiment that uses shielding bit(s) to prevent interference between the adjacent original bits (e.g., a0 and a1), the second embodiment utilizes the duplicated bits programmed to the second (e.g., odd-numbered) bit lines to act as shielding bits to prevent interference between the adjacent duplicated bits (e.g., a0⁰ and a0¹, a0⁷ and a1⁰).

With respect to a multi-bit per cell flash memory, for example, a 3-bit per cell (3 b/cell) flash memory, as being similar to the first embodiment, three methods of programming data to a multi-bit per cell flash memory are provided as follows.

In a first method of programming data to a multi-bit per cell flash memory, as exemplified in FIG. 5C, the duplicated bits (e.g., a0⁰, a0¹, ... a0⁷) at both the first and the second bit lines are programmed to all pages (i.e., LSB, CSB and MSB pages) of a word line.

In a second method of programming data to a multi-bit per cell flash memory, only the LSB page is programmed with the duplicated bits, while other page(s) (e.g., CSB and MSB pages) are programmed with dummy data.

In a third method of programming data to a multi-bit per cell flash memory, the multi-bit per cell flash memory is configured, if the flash memory supports such configuration, as a single-bit per cell flash memory, which is then programmed with the duplicated bits at both the first and the second bit lines. Alternatively, in the third method, only the LSB page is programmed with the duplicated bits at both the first and the second bit lines.

Alternative Embodiment 2

FIG. 6A and FIG. 6B illustrate a method of accessing a non-volatile memory according to an alternative second embodiment of the present invention. Compared with the second embodiment illustrated in FIG. 5B to FIG. 5C, duplicated bits corresponding to each original bit of the present embodiment are programmed to noncontinuous first (e.g., even-numbered) bit lines of a word line, while dummy data DD (e.g., bits "1") acting as shielding bits are programmed to noncontinuous second (e.g., odd-numbered) bit lines of the word line.

FIG. 6C further shows an example, in which the dummy data are programmed to the second bit lines of one word line, and are programmed to the first bit lines of an adjacent word line. The duplicated bits are programmed to the first bit lines of one word line, and the same duplicated bits (or inverted duplicated bits) are programmed to the second bit lines of an adjacent word line. It is noted that the duplicated bits programmed to the first bit lines of one word line may be compared to the duplicated bits programmed to the second bit lines of an adjacent word line to check integrity of data.

FIG. 6D shows a further example that is programmed as in FIG. 6C. Moreover, another word line that is not necessarily adjacent to the previous two word lines is programmed with inverted duplicated bits (or non-inverted duplicated bits) at first bit lines and with dummy data at second bit lines. Accordingly, the duplicated bits of the first bit lines at the two word lines may be compared (e.g., by exclusive OR operation) to check integrity of data, or to check presence of bad column.

Embodiment 3

Figure 7A:
FIG. 7A shows schematic diagram illustrating a method of accessing a non-volatile memory according to a third embodiment of the present invention.

FIG. 7A shows a schematic diagram illustrating a method of accessing a non-volatile memory according to a third embodiment of the present invention. In the embodiment, original bits of data (i.e., original data page) are duplicated on a page level to result in duplicated bits (i.e., duplicated data page). As exemplified in FIG. 7A, original data comprise 26 bytes A, B, Z, each including eight original bits, that is, A=(a0, a1, ... a7), B=(b0, b1, ... b7), ... Z=(z0, z1, ... z7).

The original data page is duplicated on a page level, therefore generating duplicated data page (a0¹, a1¹, ... a7¹), (b0¹, b1¹, ... b7¹), ... (z0¹, z1¹, ... z7¹) respectively. According to one aspect of the embodiment, as shown in FIG. 7B, original data page is programmed to noncontinuous first (e.g., even-numbered) bit lines of a word line, and duplicated data page is programmed to noncontinuous second (e.g., odd-numbered) bit lines of the word line. The present embodiment utilizes the duplicated data page programmed to the second (e.g., odd-numbered) bit lines to act as shielding bits to prevent interference between adjacent original bits.

With respect to a multi-bit per cell flash memory, for example, a 3-bit per cell (3 b/cell) flash memory, as being similar to the first or second embodiment, three methods of programming data to a multi-bit per cell flash memory are provided as follows.

In a first method of programming data to a multi-bit per cell flash memory, as exemplified in FIG. 7C, the original data page at the first bit lines and the duplicated data page at the second bit lines are programmed to all pages (i.e., LSB, CSB and MSB pages) of a word line.

In a second method of programming data to a multi-bit per cell flash memory, only the LSB page is programmed with the original data page and the duplicated data page at the first and the second bit lines, respectively, while other page(s) (e.g., CSB and MSB pages) are programmed with dummy data.

In a third method of programming data to a multi-bit per cell flash memory, the multi-bit per cell flash memory is configured, if the flash memory supports such configuration, as a single-bit per cell flash memory, which is then programmed with the original data page and the duplicated data page at the first and the second bit lines, respectively. Alternatively, in the third method, only the LSB page is programmed with the original data page at the first bit lines and the duplicated data page at the second bit lines, respectively.

Alternative Embodiment 3

FIG. 8A and FIG. 8B illustrate a method of accessing a non-volatile memory according to an alternative third embodiment of the present invention. Compared with the third embodiment illustrated in FIG. 7B to FIG. 7C, original data page is programmed to noncontinuous first (e.g., even-numbered) bit lines of a word line, while dummy data DD (e.g., bits "1") acting as shielding bits are programmed to noncontinuous second (e.g., odd-numbered) bit lines of the word line.

Embodiment 4

FIG. 9A illustrates a method of accessing a non-volatile memory according to a fourth embodiment of the present invention. In the embodiment, as being similar to the first embodiment, original bits of data are duplicated in turn on a bit level to result in duplicated bits, which are followed with at least one shielding bit (sb). According to one aspect of the embodiment, a next word line acts as (word-line) shielding by programming at least one data page with dummy data (DD). In a specific example, the word line acting as shielding bits is not programmed, or equivalently speaking, is programmed with all bits "1."

FIG. 9B shows another example illustrating a method of accessing a non-volatile memory according to the fourth embodiment of the present invention. In the embodiment, as being similar to the second embodiment, duplicated bits corresponding to each original bit are programmed to noncontinuous first (e.g., even-numbered) bit lines of a word line, and said duplicated bits are also programmed to noncontinuous second (e.g., odd-numbered) bit lines of the word line. According to one aspect of the embodiment, a next word line acts as shielding bits by programming at least one data page with dummy data (DD). In a specific example, the word line acting as shielding bits is not programmed, or equivalently speaking, is programmed with all bits "1."

FIG. 9C shows a further example illustrating a method of accessing a non-volatile memory according to the fourth embodiment of the present invention. In the embodiment, as being similar to FIG. 9A, duplicated bits are programmed to a word line (e.g., WL0), followed with an adjacent word line (WL1) being programmed with dummy data. Moreover, another pair of two word lines that are not necessarily adjacent to the first pair of the word lines are programmed with inverted duplicated bits (or non-inverted duplicated bits) at one word line and with dummy data at another word line. Accordingly, the duplicated bits of the two pair of word lines may be compared (e.g., by exclusive OR operation) to check integrity of data, or to check presence of bad column.

With respect to the memory system shown in FIG. 2, in a mass production stage, the memory controller 21 may read system information (such as bad column) from the memory 22 by a program provided by a host (not shown). Accordingly, the memory controller 21 may then write some initialization information (e.g., firmware, controller configuration parameters, etc.) to the memory 22. However, in a stage other than the mass production, as no host is available, the memory controller 21 cannot properly recognize the memory 22, and thus cannot be aware of bad column. FIG. 10 illustrates a method of accessing a non-volatile memory taking bad column into consideration. As shown in FIG. 10, the duplicated bits and associated shielding bit(s) are programmed to a first word line WL0. If a bad column (e.g., BL2) is encountered, the duplicated bits (e.g., $a0^0, a0^1, \ldots a0^6$) corresponding to an original bit are allocated again at following bit lines (e.g., BL8-BL14). The duplicated bits are repeated until the bad column is no longer encountered, and then allocate the next duplicated bits (e.g., $a1^0, a1^1, \ldots a1^6$). At another word line (e.g., WLn), if bad column is encountered, the (non-inverted) duplicated bits (e.g., $a0^0, a0^1, \ldots a0^6$) are allocated to program. The duplicated bits are repeated until the bad column is no longer encountered, and then allocate the inverted duplicated bits (e.g., $\sim a0^0, \sim a0^1, \ldots \sim a0^6$). As exemplified in FIG. 10, the duplicated bits are followed with at least one shielding bit (sb), and a next word line is programmed with dummy data (DD) to act as shielding bits as being similar to FIG. 9A.

While reading data from the flash memory that is programmed as in FIG. 10, the retrieved duplicated bits and the inverted duplicated bits are subjected to bit-wise logical exclusive-OR (XOR) operation. A false ("0") result of the XOR operation indicates that a bad column is encountered, and the retrieved duplicated bits should be discarded. Accordingly, the bad column can thus be skipped.

Although specific embodiments have been illustrated and described, it will be appreciated by those skilled in the art that various modifications may be made without departing from the scope of the present invention, which is intended to be limited solely by the appended claims.

What is claimed is:

1. A method of accessing a non-volatile memory, comprising:
   duplicating original bits of data on a bit level to generate a plurality of duplicated bits corresponding to each said original bit;
   providing at least one shielding bit between the plurality of duplicated bits corresponding to different original bits;
   programming the duplicated bits and the at least one shielding bit to the non-volatile memory; and
   generating the original bits of data from the duplicated bits.

2. The method of claim 1, wherein the non-volatile memory comprises a flash memory.

3. The method of claim 1, wherein the data comprise protected data and at least one protecting code that is used for error detection and/or correction to ensure integrity of the protected data.

4. The method of claim 1, wherein the at least one shielding bit is programmed with data that is represented by a lowest voltage level.

5. The method of claim 1, wherein the duplicated bits corresponding to each said original bit are followed with at least one shielding bit that acts as the shielding.

6. The method of claim 1, wherein the shielding bit is programmed with dummy data.

7. The method of claim 1, wherein the duplicated bits corresponding to each said original bit are programmed to non-continuous first bit lines of a word line and to non-continuous second bit lines of the word line, the first bit lines being interspersed with the second bit lines such that the duplicated bits of the second bit lines act as the shielding bits.

8. The method of claim 7, wherein the first bit lines are even-numbered bit lines, and the second bit are odd-numbered bit lines.

9. The method of claim 1, wherein the duplicated bits corresponding to each said original bit are programmed to non-continuous first bit lines of a word line and dummy data are programmed to non-continuous second bit lines of the word line, the first bit lines being interspersed with the second bit lines such that the dummy data of the second bit lines act as the shielding bits.

10. The method of claim 1, wherein the duplicated bits corresponding to each said original bit are programmed to non-continuous first bit lines of a first word line and to non-continuous second bit lines of an adjacent second word line, and dummy data are programmed to non-continuous second bit lines of the first word line and to non-continuous first bit lines of the second word line, the first bit lines being interspersed with the second bit lines such that the dummy data of the second bit lines act as the shielding bits.

11. The method of claim 10, further comprising:
   programming non-continuous first bit lines of a third word line with inverted duplicated bits that are inverted from the duplicated bits; and
   programming non-continuous second bit lines of the third word line with dummy data.

12. The method of claim 1, wherein the duplicated bits and the shielding bits are programmed to a first word line, and dummy data are programmed to an adjacent second word line.

13. The method of claim 12, further comprising:
   programming inverted duplicated bits that are inverted from the duplicated bits to a third word line; and
   programming dummy data to a fourth word line that is adjacent to the third word line.

14. The method of claim 1, wherein the non-volatile memory comprises a multi-bit per cell memory.

15. The method of claim 14, wherein the duplicated bits and the shielding bits are programmed to all pages of a word line.

16. The method of claim 14, wherein the duplicated bits are programmed to a least significant bit (LSB) page of a word line, and dummy data are programmed to other pages of the word line.

17. The method of claim 14, wherein the multi-bit per cell memory is configured as a single-bit per cell memory, which is then programmed with the duplicated bits.

18. The method of claim 14, wherein only a least significant bit (LSB) page of a word line is programmed.

19. The method of claim 1, wherein the generating step comprises:
balloting the programmed duplicated bits corresponding to one said original bit, according to which majority of the programmed duplicated bits is determined as the original bit.

20. The method of claim 1, wherein the generating step comprises:
selecting one bit of the programmed duplicated bits corresponding to different original bits;
merging selected bits of the original bits of data; and
verifying the merged bits.

21. The method of claim 1, further comprising:
while programming to a first word line, allocating the duplicated bits corresponding to the original bit until a bad column is not encountered;
while programming to a second word line, allocating the duplicated bits corresponding to the original bit if a bad column is encountered, programming inverted duplicated bits that are inverted from the duplicated bits if the bad column is not encountered.

22. The method of claim 21, the duplicated bits and the inverted duplicated bits are respectively followed, with the at least one shielding bit.

23. The method of claim 21, in the generating step, further comprising:
reading the first word line and the second word line; and
comparing the data read from the first word line and the data read from the second word line to check presence of a bad column.

24. The method of claim 23, wherein the comparing step is performed on the read duplicated bit and the read inverted duplicated bit by a bit-wise logical exclusive-OR (XOR) operation.

25. The method of claim 23, wherein the generating step further comprises:
discarding the duplicated bits corresponding to the original bit in the first word line if the duplicated bits encounter the bad column.

\* \* \* \* \*